(12) United States Patent  (10) Patent No.: US 8,203,101 B2
Miyamoto et al.  (45) Date of Patent: Jun. 19, 2012

(54) CONVEYING DEVICE

(75) Inventors: Akira Miyamoto, Osaka (JP); Daisuke Sado, Osaka (JP); Akira Okamoto, Osaka (JP); Hideki Matsuo, Osaka (JP); Yasuhiro Nishimori, Osaka (JP)

(73) Assignee: DAIHEN Corporation, Osaka (JP)

( * ) Notice: Subject to any disclaimer, the term of this patent is extended or adjusted under 35 U.S.C. 154(b) by 338 days.

(21) Appl. No.: 12/529,471

(22) PCT Filed: Mar. 2, 2007

(86) PCT No.: PCT/JP2007/054065
§ 371 (c)(1),
(2), (4) Date: Sep. 1, 2009

(87) PCT Pub. No.: WO2008/120294
PCT Pub. Date: Oct. 9, 2008

(65) Prior Publication Data
US 2010/0068025 A1  Mar. 18, 2010

(51) Int. Cl.
*A21B 1/00* (2006.01)
*B65G 1/133* (2006.01)

(52) U.S. Cl. ...... 219/405; 219/392; 219/439; 414/749.1

(58) Field of Classification Search .................. 219/405, 219/392, 439; 700/900; 901/27, 50; 414/749.1
See application file for complete search history.

(56) References Cited

U.S. PATENT DOCUMENTS

| 5,183,402 A | 2/1993 | Cooke et al. |
| 5,489,192 A | 2/1996 | Taniguchi |
| 7,073,834 B2 | 7/2006 | Matsumoto et al. |
| 7,306,423 B2 | 12/2007 | Ogawa et al. |
| 7,692,120 B2 * | 4/2010 | Koike .......................... 219/405 |

FOREIGN PATENT DOCUMENTS

| JP | 5-218052 | 8/1993 |
| JP | 6-55482 | 3/1994 |
| JP | 6-204316 | 7/1994 |
| JP | 10-215062 | 8/1998 |
| JP | 2005-125479 | 5/2005 |
| JP | 2005-186259 | 7/2005 |
| JP | 2006-41496 | 2/2006 |
| JP | 2006-116630 | 5/2006 |
| TW | 200625511 A | 7/2006 |

* cited by examiner

*Primary Examiner* — Shawntina Fuqua
(74) *Attorney, Agent, or Firm* — Hamre, Schumann, Mueller & Larson, P.C.

(57) ABSTRACT

A conveying device A is disposed inside a vacuum chamber B, includes a fixation base 1; a swivel base which is held rotatably with respect to the fixation base 1; linear movement mechanisms 3A, 3B supported by the swivel base 2; and hands 4A, 4B supported by the linear movement mechanisms 3A, 3B; and a transports work W placed on the hands 4A, 4B by operation of the linear movement mechanism 3A, 3B. Radiation plates 62, 63, 65 are provided at appropriate locations on a lower surface side of the swivel base or of the linear movement mechanisms 3A, 3B. The vacuum chamber is provided with heat absorption plates 61, 66 on a wall which faces the lower surface side of the swivel base 2.

8 Claims, 6 Drawing Sheets

CONVEYING DEVICE

TECHNICAL FIELD

The present invention relates to conveying devices for transporting a thin platy work such as a heated substrate, in a vacuum environment.

BACKGROUND ART

An example of conveying device for conveying a thin platy work in a vacuum environment is disclosed in the Patent Document 1. The conveying device includes a pair of link arm mechanisms provided on a swivel base. An end portion of each of the link arm mechanisms is provided with a hand which is capable of horizontally holding a platy work such as a glass substrate for a liquid crystal display panel. When the swivel base rotates about a vertical axis on a fixation base, the pair of link arm mechanisms rotate correspondingly. When the link arm mechanisms swivel, the platy work held by the hands is moved linearly within a horizontal plane. Thus, the platy work is transported from a predetermined position to another position.

Another example of conveying device is disclosed in the Patent Document 2. The swivel base of the conveying device is provided with a guide rail for supporting and guiding the hand in a predetermined direction when the link arm mechanisms swivel. With this arrangement, the hand holding the platy work can be moved linearly in a more stable attitude.

Such conveying devices are used widely in e.g. a manufacturing process of liquid crystal display panels for moving platy works in and out of a process chamber. In such a manufacturing process, the conveying device is used for transporting heated glass substrates in a vacuum environment in a clean process, for example.

However, the above-described conventional conveying device may not endure the thermal environment in transportation of heated platy works in a vacuum environment. Specifically, in using the conveying devices, the fixation base is disposed in an atmospheric environment while the swivel base is disposed in the space inside of a transportation chamber kept in a vacuum condition, for example. In transportation of the platy work, when the heated work is held by the hand, radiation heat irradiated from the work may cause deformation of the link arm mechanisms close to the hand. Thus, it may become difficult to ensure transportation accuracy.

Further, in cases where the swivel base is disposed in a vacuum environment, a vacuum seal is provided at an appropriate position such as a periphery of the swivel base for ensuring the vacuum, for example. In transportation of heated platy works, the vacuum seal is subject to heat from the platy works. Thus, the function of the vacuum seal may be deteriorated, resulting in diminishing airtightness.

Patent Document 1: JP-A-2005-186259
Patent Document 2: JP-A-2005-125479

DISCLOSURE OF THE INVENTION

The present invention has been proposed under the above-described circumstances, and it is therefore an object of the present invention to provide a conveying device which is capable of eliminating or reducing the disadvantage caused by the heat from the work in transportation of the heated platy work in a vacuum environment.

According to the present invention, there is provided a conveying device to be installed in a vacuum chamber, comprising: a fixation base; a swivel base held rotatably with respect to the fixation base; a linear movement mechanism supported by the swivel base; and a hand supported by the linear movement mechanism; wherein the conveying device transports a work placed on the hand while maintaining the work in a horizontal state, by operation of the linear movement mechanism at a desired rotating position of the swivel base, wherein a heat radiation surface is provided at a lower surface of the swivel base or the linear movement mechanism, and wherein a heat absorption surface is provided at least part of a wall forming the vacuum chamber and facing the lower surface of the swivel base.

Preferably, a heat reflection surface for reflecting heat from a side of the hand is provided at an upper surface of the swivel base or the linear movement mechanism.

Preferably, the heat absorption surface is provided at at least part of a bottom surface of the vacuum chamber or of a surface of the fixation base exposed to the vacuum chamber.

Preferably, the conveying device further comprising a cooler for ejecting heat absorbed by the heat absorption surface to outside.

Preferably, the cooler includes a refrigerant circulation channel routed so as to establish contact with a member provided with the heat absorption surface.

Preferably, the linear movement mechanism includes a link arm mechanism constituted of a plurality of arms connected with each other. The heat reflection surface is provided on an upper surface of the link arm mechanism, and the heat radiation surface is provided on a lower surface side of the link arm mechanism.

Preferably, the linear movement mechanism further includes a guide rail supported by the swivel base and guiding the hand in a predetermined direction. The heat reflection surface is provided between the guide rail and the hand.

BEST MODE FOR CARRYING OUT THE INVENTION

Preferred embodiments of a conveying device according to the present invention and of a cooling arrangement including the conveying device will be described below with reference to the drawings.

Figure 1:
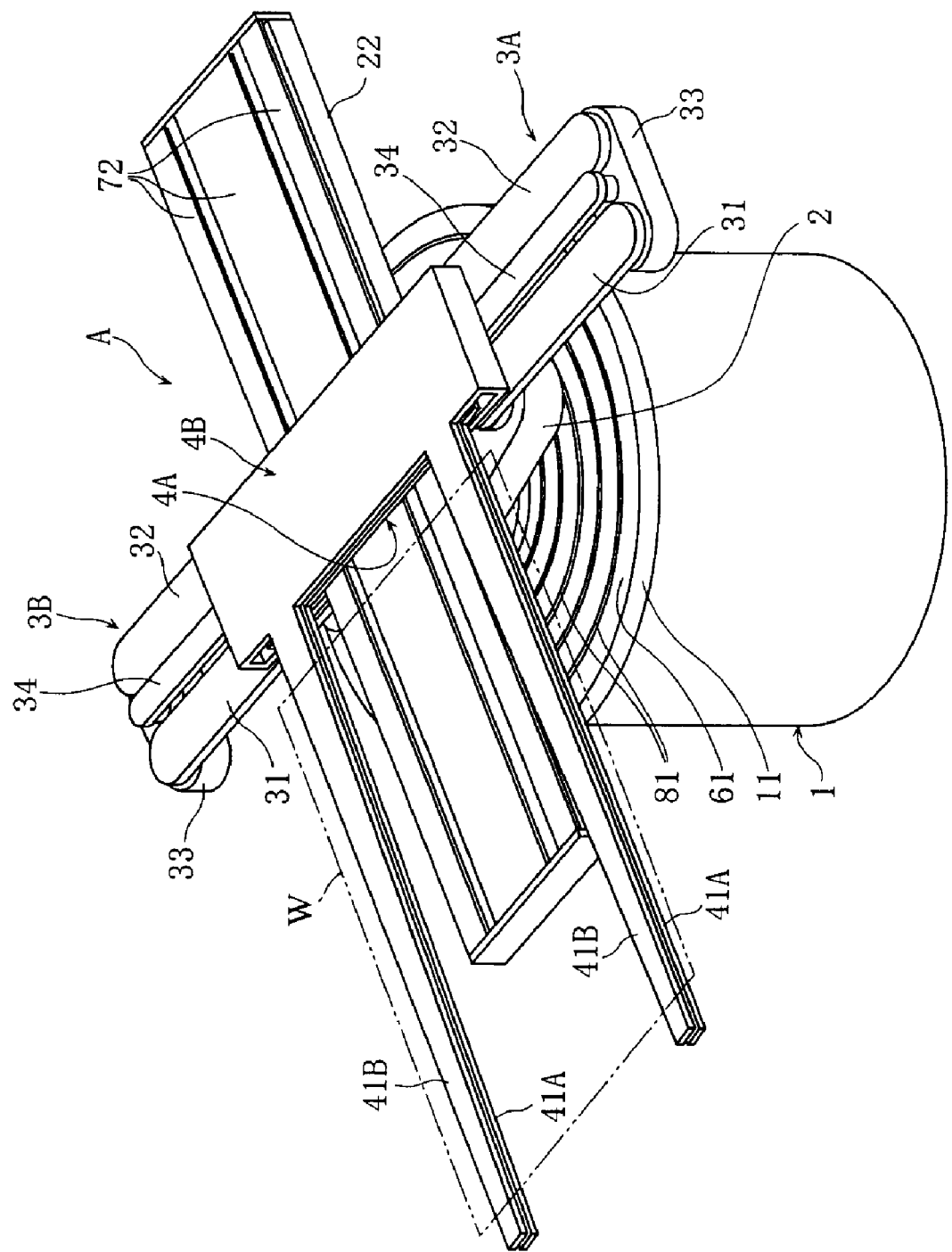
FIG. 1 is an overall perspective view of a conveying device according to the present invention.
Figure 2:
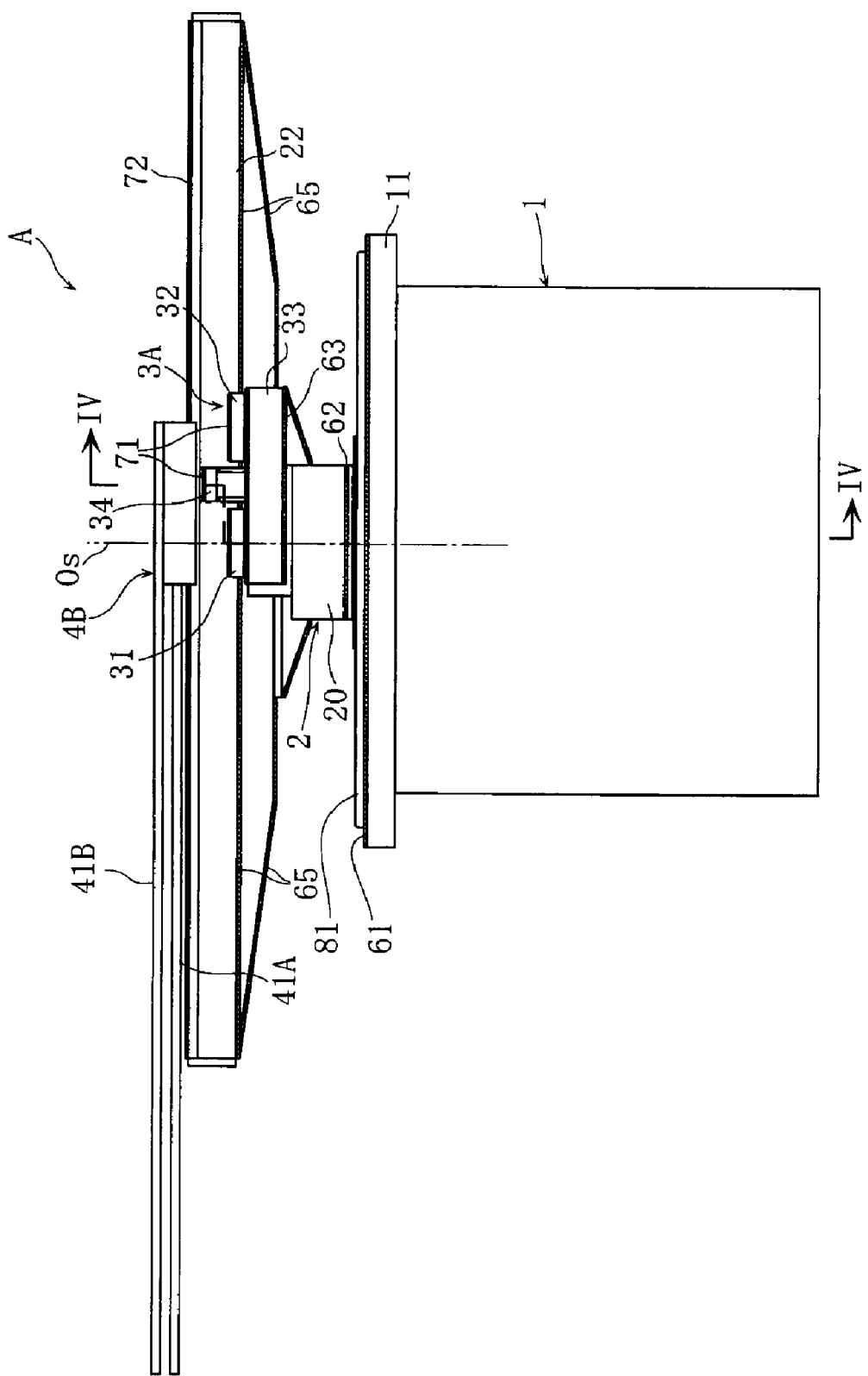
FIG. 2 is a side view of the conveying device in FIG. 1.
Figure 3:
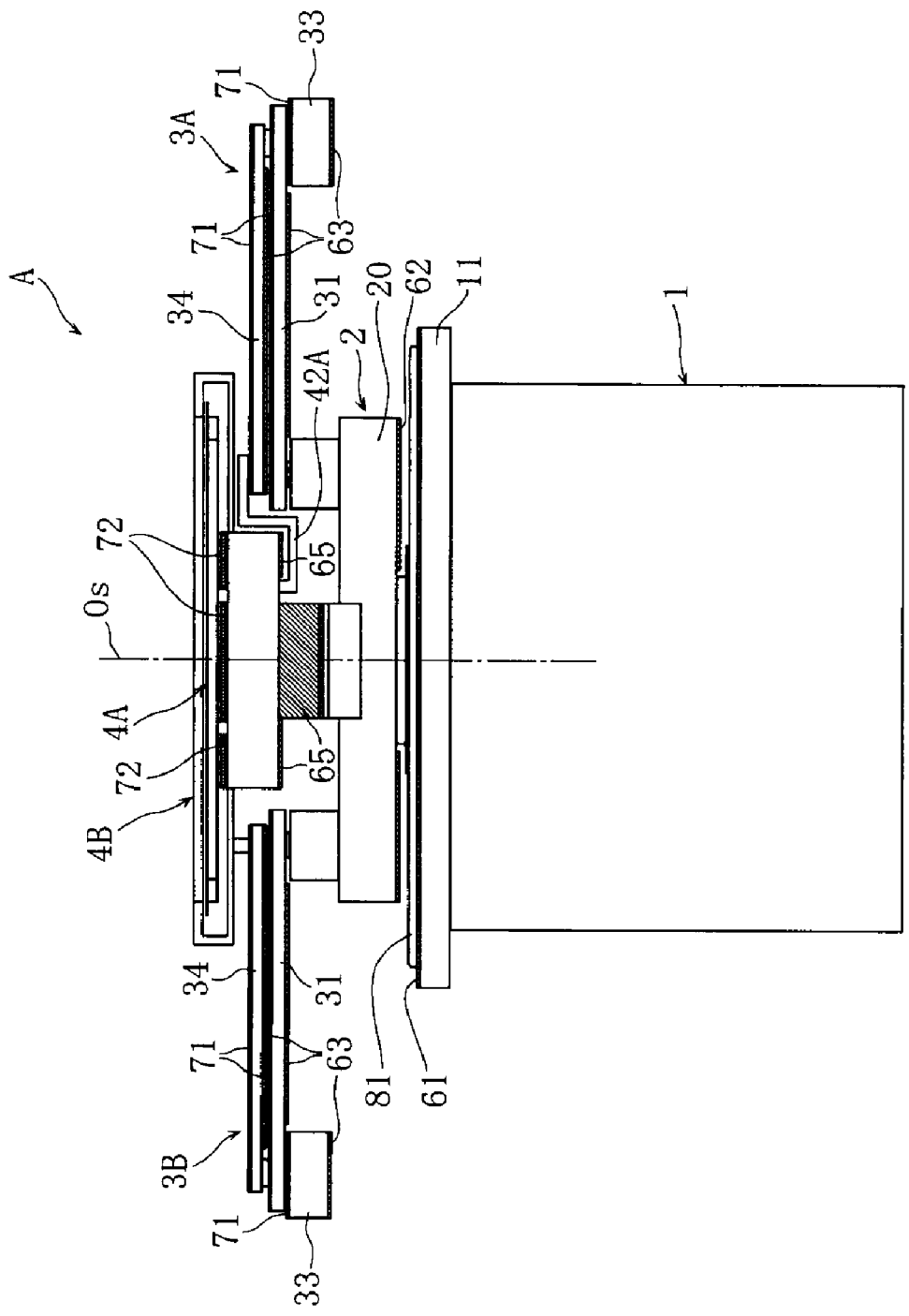
FIG. 3 is a front view of the conveying device in FIG. 1.

FIG. 1 to FIG. 4 show a conveying device according to the present invention. The conveying device A is for transporting a thin platy work such as a substrate for a liquid crystal display panel, for example. As shown in FIG. 1 to FIG. 3, the conveying device A includes a fixation base 1, a swivel base 2 which is rotatable about a vertical axis Os and supported with respect to the fixation base 1, a pair of link arm mechanisms 3A, 3B supported operatively with respect to the swivel base 2, hands 4A, 4B supported by the link arm mechanism 3A, 3B, respectively, and two sets of guide rails 5A, 5B for guiding the hands 4A, 4B in a predetermined horizontal direction, respectively. The hands 4A, 4B are for holding a thin platy work W in a horizontal attitude.

Figure 4:
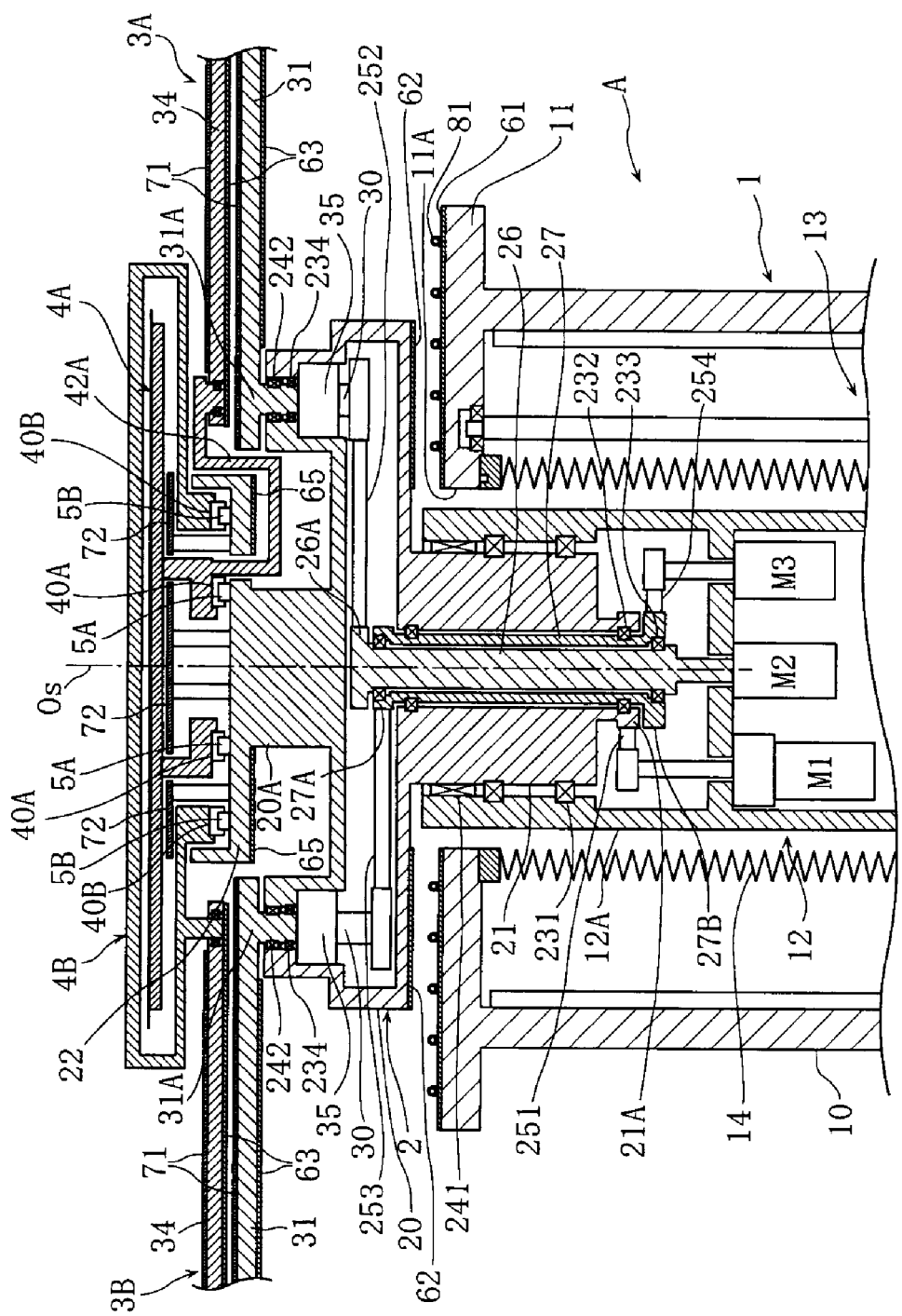
FIG. 4 is a partial sectional view taken along lines IV-IV in FIG. 2.

As shown clearly in FIG. 4, the fixation base 1 includes a housing 10 which is hollow and has a substantially columnar outer shape. The upper end wall provides an flange portion 11 protruding outward. A center hole 11A is formed at the flange portion 11.

Further, in the present embodiment, a heat absorption plate 61 is provided at the upper surface of the flange portion 11. The heat absorption plate 61 is made of a material having a high emissivity, such as aluminum, and has a black surface which is subjected to alumite treatment, for example. The upper surface of the heat absorption plate serves as a heat absorption surface. The emissivity is about 0.9, for example. Piping 81, which is arranged in concentric manner at a predetermined interval and serves to circulate refrigerant, is provided on the upper surface of the heat absorption plate 61. The piping 81 are connected with a pump (not illustrated) for supplying air functioning as refrigerant, for example. The heat absorption plate 61, the piping 81 and the pump serves as a cooling means for ejecting heat absorbed in the heat absorption surface to outside. The heat absorption plate 61 is hatched in FIG. 2 and FIG. 3.

Inside the housing 10, a lift base 12 is supported to perform lifting operation. The lift base 12 includes a cylindrical portion 12A and an unillustrated outward-protruding flange portion provided at the lower end of the cylindrical portion 12A. The upper end of the cylindrical portion 12A protrudes upward through the center opening 11A. The entirety of the lift base 12 is movable in the up-down direction by means of a ball screw mechanism 13, for example.

A bellows 14 is provided between the flange portion 11 of the housing 10 and the outward-protruding flange portion formed at the lower end of the lift base 12, so as to enclose the cylindrical portion 12A of the lift base 12. The bellows expands and contracts in accordance with the up-down movement of the lift base 12, and provides air-tight sealing between the flange portion 11 of the housing 10 and the outward-protruding flange portion of the lift base 12.

The swivel base 2 has a housing 20 and a cylindrical shaft 21 integrally connected to the lower portion of the housing. The cylindrical shaft 21 is rotatably supported inside the cylindrical portion 12A of the lift base 12 via a bearing 231.

Further, a vacuum seal 241 is provided between the cylindrical portion 12A and the cylindrical shaft 21. The vacuum seal 241 ensures airtightness by insulating the space above the vacuum seal 241 from the space inside the fixation base 1 below the vacuum seal 241.

A pulley 21A is integrally formed at the lower end of the cylindrical shaft 21. An endless belt 251 is mounted to connect the pulley 21A and a pulley mounted on the output shaft of a motor M1 supported inside the cylindrical portion 12A. Thus, when the motor M1 is driven, the swivel base 2 rotates about the vertical axis Os.

Transmission shafts 26, 27 are inserted in a coaxial manner into the cylindrical shaft 21 of the swivel base 2 for swiveling the link arm mechanisms 3A, 3B. The transmission shaft 27 is a cylindrical shaft and is supported rotatably inside the cylindrical shaft 21 via a bearing 232. The transmission shaft 26 is rotatably supported inside the transmission shaft 27 via a bearing 233.

A heat radiation plate 62 is provided at the lower surface of the housing 20 of the swivel base 2. The heat radiation plate 62 is made of a material having high emissivity such as aluminum and has a black surface subjected to alumite treatment, for example. The emissivity is about 0.9, for example. The heat radiation plate 62 is hatched in FIG. 2 and FIG. 3.

Pulleys 26A, 27A are provided with the upper ends of the transmission shafts 26, 27, respectively. Endless belts 252,
253 are mounted to connect the pulleys 26A, 27A with rotation shafts 30 of the link arm mechanisms 3A, 3B, respectively. On the other hand, the lower end of the transmission shaft 26 is connected with the output shaft of a motor M2 which is supported inside the cylindrical portion 12A. A pulley 27B is provided at the lower end of the transmission shaft 27. An endless belt 254 is mounted to connect the pulley 27B with a pulley on the output shaft of a motor M3 supported inside the cylindrical portion 12A. When the motors M2, M3 are driven, the link arm mechanisms 3A, 3B swivel in accordance with rotation of the rotation shafts 30.

Each of the link arm mechanisms 3A, 3B is made of a plurality of arms 31 through 34 connected to each other and functions as a linear movement mechanism. The arms 31 through 34 are made of a metal, such as stainless steel having predetermined rigidity. Since the principal construction and operation of the link arm mechanisms 3A, 3B are similar to conventional ones, detailed description will be omitted. The base end 31A of the arm 31 is rotatably supported via a bearing 234 in the opening provided at the upper portion of the housing 20 in the swivel base 2. The lower end of the base end 31A is connected with the rotation shaft 30 via a speed reduction mechanism 35. A vacuum seal 242 is provided in the space above the bearing 234 between the base end 31A and the upper portion of the housing 20 for ensuring airtightness. Thus, the inside space of the housing 20 is sealed airtight.

Heat reflection plates 71 are provided at the upper surfaces of the arms 31 through 34. The heat reflection plates 71 are made of stainless steel, for example. The upper surfaces (surfaces facing the hands 4A, 4B) of the heat reflection plates 71 are mirror-finished to serve as heat reflection surfaces. Thus, the upper surfaces have small emissivity of about 0.1, for example. The heat reflection plates 71 are omitted in FIG. 1, and the heat reflection plates 71 are hatched in FIG. 2 and FIG. 3.

Heat radiation plates 63 are provided at the lower surfaces of the arms 31 through 34. The heat radiation plates 63 are made of a material having high emissivity, such as aluminum, and a black surface subjected to alumite treatment, for example. The lower surface of the heat radiation plates function as a heat radiation surface. The emissivity is about 0.9, for example. The heat radiation plates 63 are hatched in FIG. 2 and FIG. 3.

Figure 5:
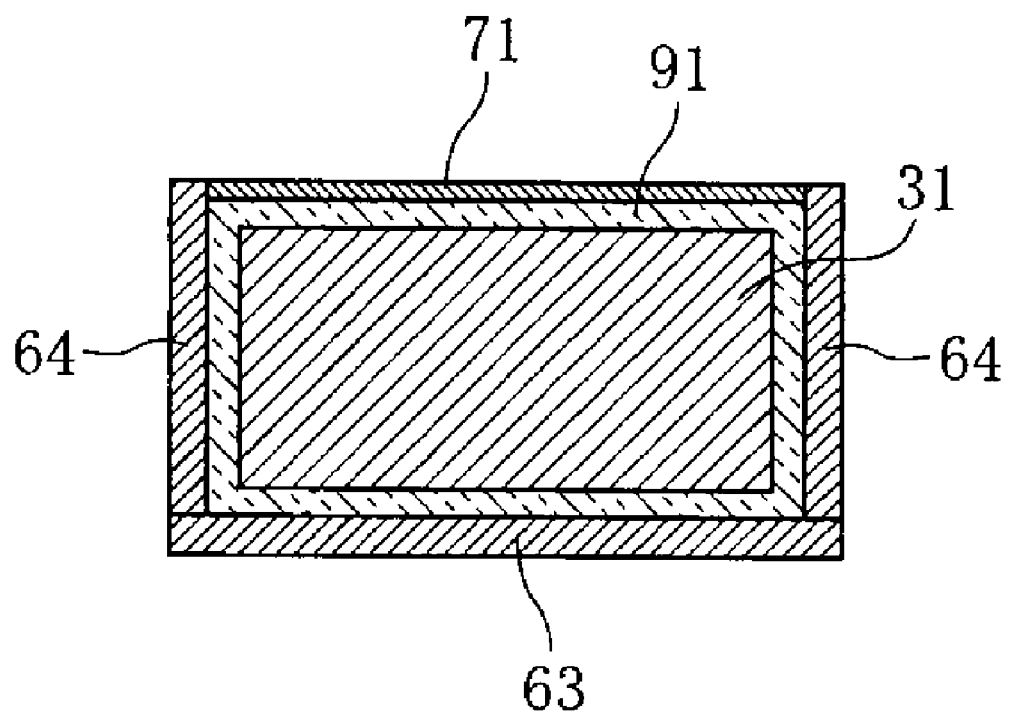
FIG. 5 shows a sectional structure of an arm.

FIG. 5 shows an example of a sectional structure of the arm 31. A heat insulation member 91 is provided at the principal portion of the arm 31 to surround the arm. The heat reflection plate 71 and the heat radiation plate 63 are provided on the arm 31 via the heat insulation member 91 which is made of ceramic, for example. Further, a heat radiation plate 64 having similar structure to that of the heat radiation plate 63 may be provided on the side surface of the arm 31. The other arms 32 through 34 may also be provided to have the similar sectional structure to that of the arm 31.

The guide rails 5A, 5B are supported by a guide member of the swivel base 2, and serve as linear movement mechanism. Specifically, as shown in FIG. 4, the swivel base has a support post 20A connected to the central upper portion of the housing 20. The guide member 22 is provided integrally at the upper portion of the support post 20A.

A heat radiation plate 65 is provided at the lower surface of the guide member 22. The heat radiation plate 65 is made of a material having high emissivity such as aluminum, and has a black surface subjected to alumite treatment, for example. The lower surface of the heat radiation plate functions as a heat radiation surface. The emissivity is about 0.9, for example. The heat radiation plate 65 is hatched in FIG. 2 and FIG. 3.

The hand 4A is supported by two inner guide rails 5A via a slider 40A. The hand 4B detours the sides of the hand 4A and is supported by two outer guide rails 5B via a slider 40B. The hands 4A, 4B are integrally formed with a plurality of fork-like holders 41A, 41B extending longitudinally of the guide member 22. The thin platy work W is placed on the holders 41A, 41B. The hand 4B is rotatably connected with a tip portion of the arm 34 (the one on the left-hand side in FIG. 4) of the link arm mechanism 3B. The hand 4A is provided with an extension 42A which extends outward below the outer guide rails 5B. The extension 42A is rotatably connected with a tip portion of the arm 34 (the one on the right-hand side in FIG. 4) of the link arm mechanism 3A.

Further, a heat reflection plate 72 is provided above the guide member 22. The heat reflection plate 72 is disposed between the hands 4A, 4B (holders 41A, 41B) and the guide rails 5A, 5B via supporting portions and serves to reflect heat from the heated work W when the works W is placed on the holders 41A, 41B. As shown in FIG. 1 and FIG. 4, the heat reflection plate 72 is divided in three pieces to avoid interference with the hands 4A, 4B. The heat reflection plate 72 is made of stainless steel, for example. The upper surface (surface facing the hands 4A, 4B) of the heat reflection plate 72 is mirror-finished to serve as a heat reflection surface. Thus, the emissivity of the upper surface is, and the emissivity is about 0.1, for example. The heat reflection plate 72 is hatched in FIG. 2 and FIG. 3.

In accordance with the swiveling movement of the link arm mechanism 3A, the lower hand 4A slides horizontally while being supported by the two inner guide rails 5A. When the other link arm mechanism 3B swivels, the upper hand 4B slides horizontally while being supported by the two outer guide rails 5B without interfering with the hand 4A. In this process, the extension 42A connecting the hand 4A to the link arm mechanism 3A, slides without being blocked by the guide member 22. Thus, the work W placed on the holders 41A, 41B of the hands 4A, 4B are transported stably.

The conveying device A having the above-described arrangement is used in manufacturing processes of liquid crystal display panels, for example, for moving a work in and out of process chambers. In this case, the conveying device A is disposed in a vacuum environment inside e.g. a transport chamber provided with a plurality of process chambers arranged at the periphery of it.

Figure 6:
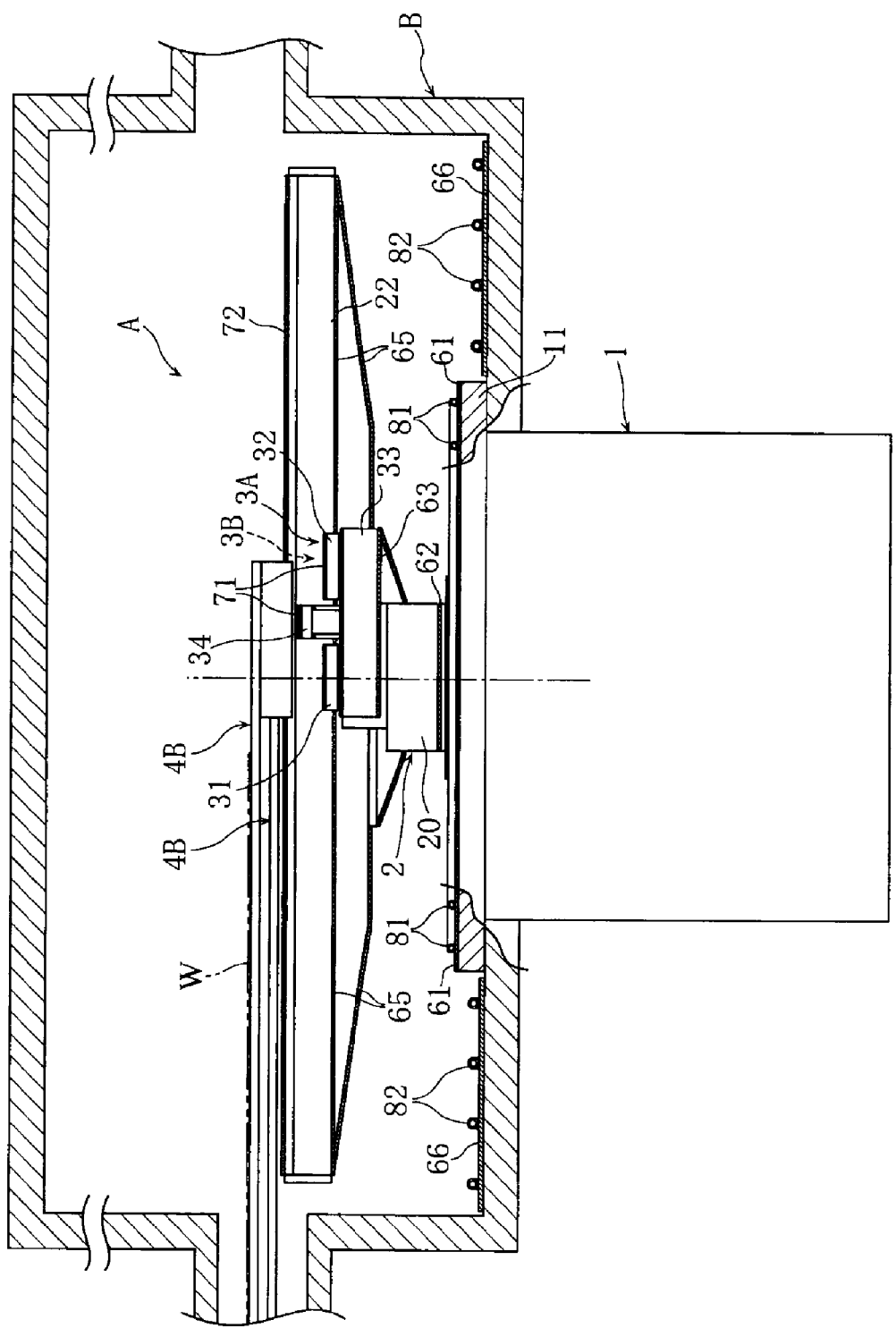
FIG. 6 is a partially sectional side view showing a state in which the conveying device according to the present invention is disposed in a vacuum chamber.

FIG. 6 shows an example of configuration in which the conveying device A is disposed in a transport chamber B serving as a vacuum chamber. A passage communicating with a load lock and a process chamber is provided at the side wall of the transport chamber B. The passages are provided with a shutter (not illustrated) which is opened only when the work W is transported to/from the load lock and the process chamber. An opening for installation of the conveying device A is provided at the bottom wall of the transport chamber B. The conveying device A is fixed in the transport chamber B with the flange portion 11 of the fixation base 1 providing airtight sealing. Specifically, the elements above the flange portion 11 are in the inner space of the transport chamber B. These elements of the conveying device A are in a vacuum environment. With such arrangement, the bottom wall of the transport chamber B and the flange portion 11 of the conveying device A in contact with the bottom wall of the transport chamber provide a wall which defines the inside space of the transport chamber B.

A heat absorption plate 66 is provided at the upper surface of the bottom wall of the transport chamber B. The heat absorption plate 66 is made of a material having high emissivity such as aluminum, and has a black surface subjected to alumite treatment, for example. The upper surface of the heat absorption plate functions as a heat absorption surface. The emissivity is about 0.9, for example. A piping 82 serving as a refrigerant circulation channel is provided at the upper surface of the heat absorption plate 66 at a predetermined interval. The piping 82 are connected with a pump (not illustrated) which supplies e.g. water functioning as a refrigerant. The heat absorption plate 66, the piping 82, and the pump function as cooling means for ejecting heat absorbed by the heat absorption surface to the outside.

In the operation of the conveying device A, if the works W such as glass substrates heated to a temperature of 250-400° C. are transported continuously in the vacuum environment, the swivel base 2 and the link arm mechanisms 3A, 3B tend to be exposed to heat from the works W. The vacuum seals 241, 242 provided around rotating portions of the swivel base 2 and the link arm mechanisms 3A, 3B can ensure airtightness to a certain temperature, however they may fail to maintain airtightness under temperature exceeding a predetermined durable temperature. Further, since the arms 31 through 34 are made of a metal such as stainless steel, the dimensions of them may involve a large error due to thermal expansion under high temperature. An error of the dimension of guide rails 5A, 5B due to thermal expansion also may occur.

On the other hand, in the present embodiment, the heat radiation plates 71, 72 for reflecting heat from the work W held by the hands 4A, 4B are provided on surfaces of the link arm mechanisms 3A, 3B which face the hands 4A, 43, and between the hands 4A, 4B and the guide rails 5A, 5B. Thus, heat radiated from the works W is reflected by the heat reflection surfaces of the heat reflection plates 71, 72. Therefore, excessive heating of the link arm mechanisms 3A, 3B and the guide rails 5A, 5B by direct radiant heat from nearby works W is prevented.

Further, as shown in FIG. 6, in the present embodiment, the heat radiation plates 62, 63, 65 is provided at appropriate positions on their lower-surface side of the swivel base 2 and link arm mechanisms 3A, 3B. In addition, the heat absorption plates 61, 66 provided with a surface having heat absorption surfaces are provided on a wall which forms the transport chamber B and faces the lower-surface side of the swivel base 2 (i.e., the upper surface of the bottom wall of the transport chamber B and the upper surface of the flange portion 11 connected with it). On the heat absorption surfaces of the heat absorption plates 61, 66, the piping 81 which serve as refrigerant circulation channels are provided. Therefore, even if the swivel base 2 and the link arm mechanisms 3A, 3B receive heat due to irradiation along the periphery of the eat reflection plates 71, 72 without being reflected by the heat reflection plates 71, 72, or heat conduction from the work W, the heat are radiated from the heat radiation plates 62, 63, 65 having relatively high temperature, toward the heat absorption plates 61, 66 having relatively low temperature. Then, heat which was absorbed by the heat absorption plates 61, 66 is effectively ejected to the outside of the transport chamber B by the refrigerant which flows through the piping 81, 82. Hence, such an arrangement as described above is suitable in preventing overheating of the link arm mechanisms 3A, 3B and the guide rails 5A, 5B.

In this way, the arrangement offered by the present embodiment allows efficient ejection of heat from the work to the outside of the transport chamber B in the case where the heated work W are transported by the conveying device A.

Thus, neither the link arm mechanisms 3A, 3B nor the guide rails 5A, 5B are overheated to an extent where thermal expansion causes unacceptably large dimensional error. Therefore, the hands 4A, 4B are operated accurately, ensuring precise and smooth transportation of the heated work W in a vacuum environment. Further, the vacuum seals 241, 242 provided around the rotating portions of the swivel base 2 and the link arm mechanisms 3A, 3B will not fail to maintain airtightness.

An embodiment of the present invention having been described thus far, the scope of the present invention is not limited to the embodiment described above. Specific arrangements in the conveying device according to the present invention may be varied in many ways within the spirit of invention.

In the above-described embodiment, the cooling means includes refrigerant circulation channels provided on the inner side of a vacuum chamber wall. Alternatively, the refrigerant circulation channel may be provided on an outer side of the vacuum chamber wall. Also, the cooling means may be provided by radiator fins provided on an outer side or inside a wall of the vacuum chamber, and these radiator fins may be cooled by a fan.

Further, the linear movement mechanism need not have guide rails for guiding the hands. Also, the linear movement mechanism may be implemented by other mechanisms than a link arm mechanism, such as a belt mechanism which moves the hands that are movably supported on guide rails.

The invention claimed is:

1. A conveying device to be installed in a vacuum chamber, comprising: a fixation base; a swivel base held rotatably with respect to the fixation base; a linear movement mechanism supported by the swivel base; and a hand supported by the linear movement mechanism;
   wherein the conveying device transports a work placed on the hand while maintaining the work in a horizontal state, by operation of the linear movement mechanism at a desired rotating position of the swivel base,
   the conveying device further comprising:
   a heat radiation surface provided at a lower surface of the swivel base or the linear movement mechanism
   a heat absorption surface facing the heat radiation surface; and
   a cooler for transferring heat absorbed by the heat absorption surface to outside; and
   wherein the cooler includes a refrigerant circulation channel held in contact with the heat absorption surface.

2. The conveying device according to claim 1, wherein a heat reflection surface for reflecting heat from a side of the hand is provided at an upper surface of the swivel base or the linear movement mechanism.

3. The conveying device according to claim 1, wherein the heat absorption surface is provided at at least part of a bottom surface of the vacuum chamber or of a surface of the fixation base exposed to the vacuum chamber.

4. The conveying device according to claim 1, wherein the linear movement mechanism includes a link arm mechanism constituted of a plurality of arms connected with each other, and
   wherein the heat reflection surface is provided on an upper surface of the link arm mechanism, and the heat radiation surface is provided on a lower surface side of the link arm mechanism.

5. The conveying device according to claim 4, wherein the linear movement mechanism further includes a guide rail supported by the swivel base and guiding the hand in a predetermined direction, and
   wherein the heat reflection surface is provided between the guide rail and the hand.

6. The conveying device according to claim 1, wherein the refrigerant circulation channel comprises a piping held in contact with the heat absorption surface.

7. The conveying device according to claim 6, wherein the piping is located at least in a region where the heat radiation surface and the heat absorption surface overlap with each other as viewed in a direction perpendicular to the heat radiation surface.

8. The conveying device according to claim 6, wherein the piping comprises at least two pipe portions held in contact with the heat absorption surface, the pipe portions being spaced apart from each other in a direction perpendicular to an axis of one of the pipe portions.

* * * * *